United States Patent [19]

Squires et al.

[11] Patent Number: 5,841,567
[45] Date of Patent: Nov. 24, 1998

[54] METHOD AND APPARATUS FOR IMAGING AT A PLURALITY OF WAVELENGTHS

[75] Inventors: David P. Squires, Lebanon; Joseph A. Wheeler, Vernon, both of Conn.

[73] Assignee: Barco Gerber Systems, South Windsor, Conn.

[21] Appl. No.: 674,766

[22] Filed: Jul. 2, 1996

[51] Int. Cl.[6] .................................................. G02B 26/08
[52] U.S. Cl. .......................................... 359/212; 359/204
[58] Field of Search ..................................... 359/196, 197, 359/204, 212–226, 584, 589, 618, 634; 358/474, 490–494, 296; 347/239, 242–243, 255, 257, 259–261; 250/578.1, 234–236; 235/470

[56] References Cited

U.S. PATENT DOCUMENTS

| | | | |
|---|---|---|---|
| 3,272,568 | 9/1966 | Koorneef et al. | 308/5 |
| 3,816,659 | 6/1974 | Landsman | 178/7.6 |
| 3,857,031 | 12/1974 | Sinclair et al. | 250/201 |
| 3,894,276 | 7/1975 | Janssen | 318/135 |
| 3,938,191 | 2/1976 | Jarmy | 360/102 |
| 4,012,676 | 3/1977 | Giebler | 318/135 |
| 4,028,732 | 6/1977 | Salter et al. | 358/289 |
| 4,131,916 | 12/1978 | Landsman | 358/285 |
| 4,186,991 | 2/1980 | Koide et al. | 350/6.91 |
| 4,209,239 | 6/1980 | Wood et al. | 354/4 |
| 4,387,452 | 6/1983 | Bricot et al. | 369/32 |
| 4,390,235 | 6/1983 | Minoura | 359/204 |
| 4,402,061 | 8/1983 | Hazet et al. | 365/127 |
| 4,409,624 | 10/1983 | Kingsley | 358/285 |
| 4,413,863 | 11/1983 | Lombard | 308/5 |
| 4,415,911 | 11/1983 | Tazaki | 346/140 |
| 4,417,330 | 11/1983 | Hazel et al. | 369/32 |
| 4,432,082 | 2/1984 | Hsieh et al. | 369/32 |
| 4,432,083 | 2/1984 | Hsieh et al. | 369/44 |
| 4,435,797 | 3/1984 | Hsieh et al. | 369/32 |
| 4,443,870 | 4/1984 | Hazel et al. | 369/44 |
| 4,445,798 | 5/1984 | Munehiro | 400/320 |
| 4,455,910 | 6/1984 | Kraft et al. | 83/874 |
| 4,476,496 | 10/1984 | Thaler | 358/286 |
| 4,489,406 | 12/1984 | Hsieh et al. | 369/32 |
| 4,494,226 | 1/1985 | Hazel et al. | 369/45 |
| 4,543,615 | 9/1985 | Van Campenhout et al. | 358/285 |
| 4,585,331 | 4/1986 | Stoffel et al. | 355/8 |
| 4,631,432 | 12/1986 | Thaler | 310/14 |
| 4,637,679 | 1/1987 | Funato . | |
| 4,662,708 | 5/1987 | Bagdal . | |

(List continued on next page.)

FOREIGN PATENT DOCUMENTS

| | | |
|---|---|---|
| 0 052 346 | 5/1982 | European Pat. Off. . |
| 30 14 409 | 10/1980 | Germany . |
| 44 11 574 | 5/1995 | Germany . |
| 2 049 300 | 12/1980 | United Kingdom . |

OTHER PUBLICATIONS

"Linear Motor Applications" by Boaz Eidelberg, Anorad Corp., Oct. 1992, 4 sheets.

"Air Bearings, Technology & Applications" by Robert Kody, Dover Instrument Corporation, Nov./Dec. 1992 3 sheets.

"The Amateur Scientist" by Shawn Carlson, Scientific American, Aug. 1996, pp. 96, 98–99.

*Primary Examiner*—James Phan
*Attorney, Agent, or Firm*—McCormick, Paulding & Huber

[57] ABSTRACT

An imaging system for imaging a substrate surface at several imaging wavelengths comprises a replaceable beam generating module, a spinning mirror and a controller. The beam generating module generates an imaging beam in dependence on beam command signals. The imaging beam has a wavelength which is a one of the plurality of imaging wavelengths. The beam generating module further presents the imaging beam along a prescribed path, and the beam generating module generates wavelength signals indicative of the imaging beam wavelength. The controller receives the wavelength signals, and generates the beam command signals in dependence on the wavelength signals. The beam command signals control generation of the imaging beam in accordance with a prescribed pattern to image upon the substrate surface.

12 Claims, 5 Drawing Sheets

U.S. PATENT DOCUMENTS

| | | | |
|---|---|---|---|
| 4,666,315 | 5/1987 | Scranton | 384/1 |
| 4,684,228 | 8/1987 | Holthusen . | |
| 4,704,712 | 11/1987 | Siryj | 369/249 |
| 4,798,478 | 1/1989 | Crystal | 384/12 |
| 4,834,353 | 5/1989 | Chitayat | 269/73 |
| 4,985,651 | 1/1991 | Chitayat | 310/12 |
| 5,089,908 | 2/1992 | Jodoin et al. | 359/216 |
| 5,098,203 | 3/1992 | Henderson | 384/12 |
| 5,157,533 | 10/1992 | Hanamoto | 359/204 |
| 5,181,137 | 1/1993 | Koide . | |
| 5,225,924 | 7/1993 | Ogawa et al. . | |
| 5,228,358 | 7/1993 | Sakino et al. | 74/479 |
| 5,309,274 | 5/1994 | Akanabe . | |
| 5,325,381 | 6/1994 | Paoli . | |
| 5,361,158 | 11/1994 | Tang | 359/204 |
| 5,387,995 | 2/1995 | Härig | 359/204 |

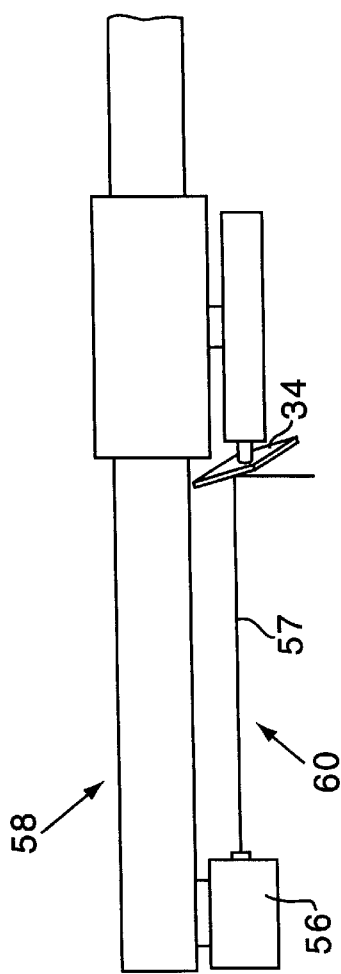
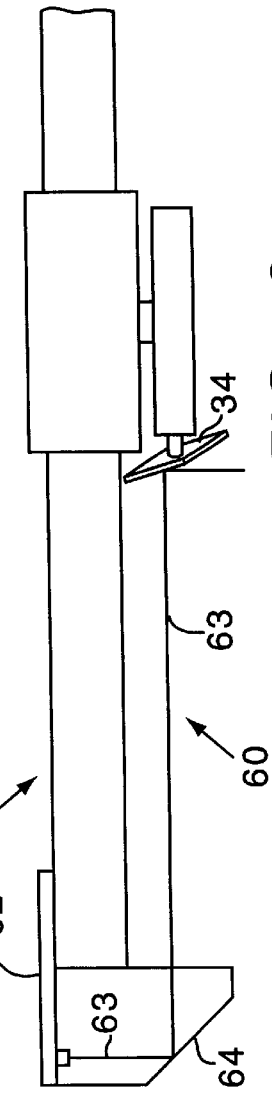
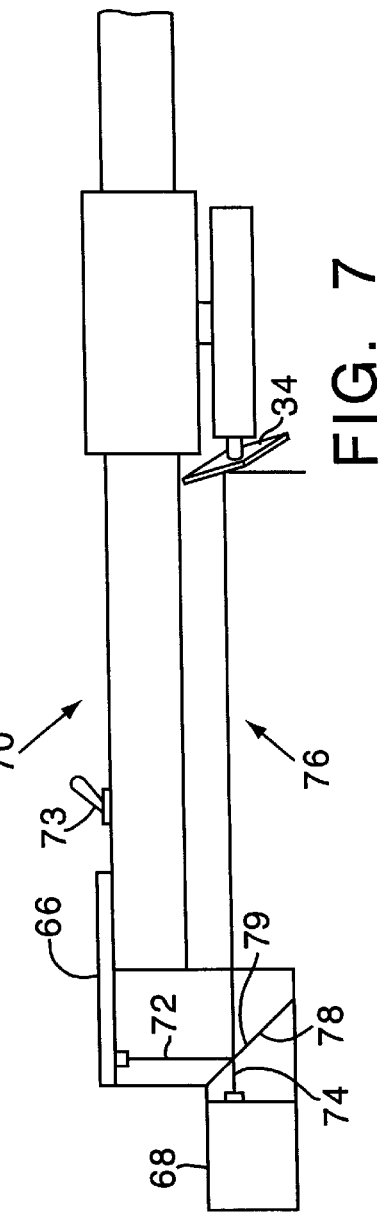
FIG. 5
FIG. 6
FIG. 7

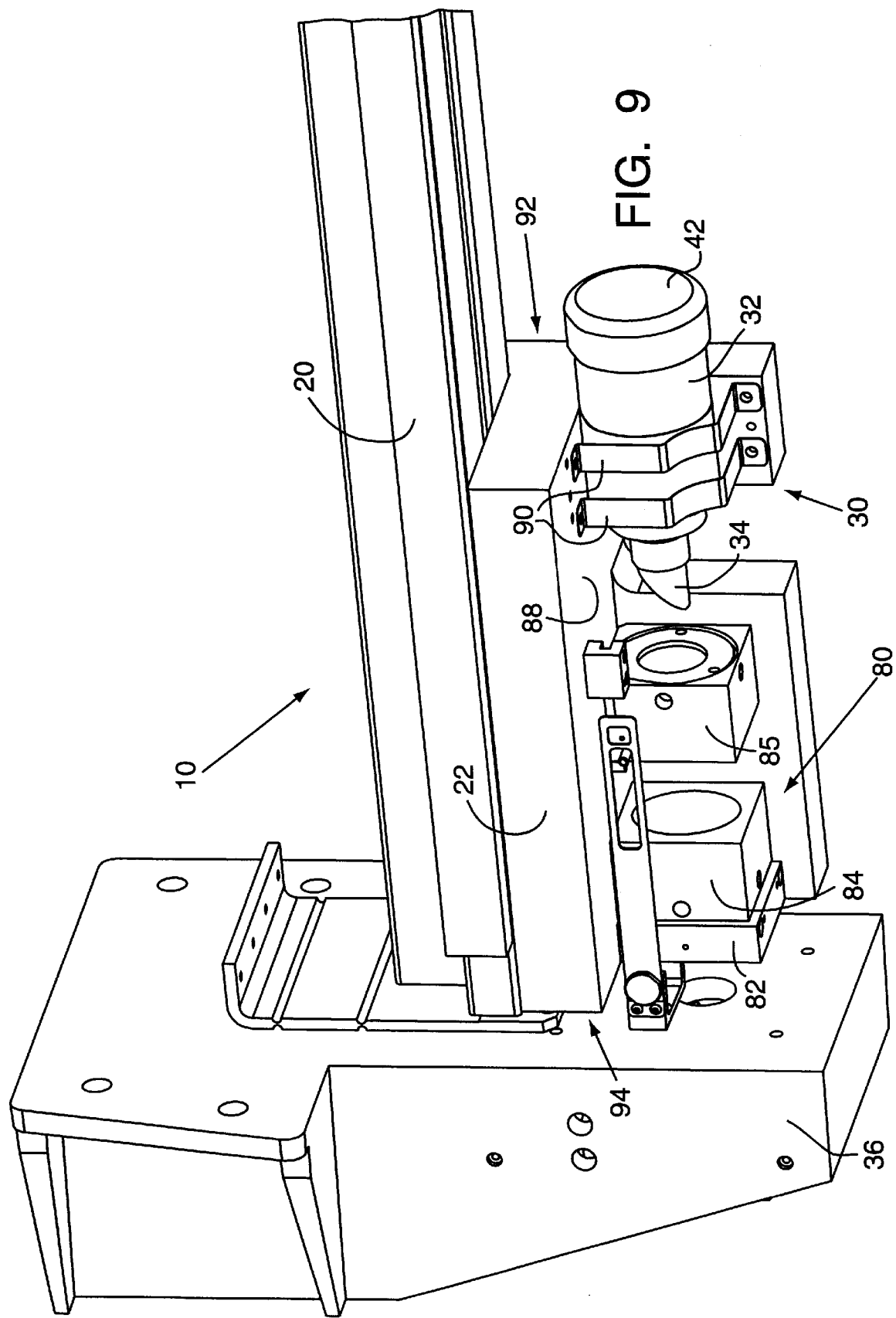

METHOD AND APPARATUS FOR IMAGING AT A PLURALITY OF WAVELENGTHS

FIELD OF THE INVENTION

The present invention relates to imaging systems in general and, more particularly, to imaging systems which are capable of imaging at a plurality of imaging wavelengths.

CROSS REFERENCE TO RELATED APPLICATIONS

Some of the matter contained herein is disclosed and claimed in the co-pending and commonly owned U.S. patent application Ser. No. 08/674,763 filed on Jul. 2, 1996, entitled "Magnetically Preloaded Air Bearing Motion System For An Imaging Device" (Attorney Docket No. I48-1075); U.S. patent application Ser. No. 08/674,439 filed on Jul. 2, 1996, entitled "Apparatus And Method For Positioning A Lens To Expand An Optical Beam Of An Imaging System" (Attorney Docket No. I 48-1095) and U.S. patent application Ser. No. 08/677,343 filed on Jul. 2, 1997 now U.S. Pat. No. 5,640,473 issued Jun. 17, 1996entitled "Method And Apparatus For Generating An Optical Beam For Use In An Imaging System" (Attorney Docket No. I 48-1100) incorporated herein by reference.

BACKGROUND OF THE INVENTION

Imaging systems of both planar and internal drum design are known in the art. These devices are used in the graphics arts fields as well as in the fabrication of printed circuit boards. Planar imaging systems, such as are disclosed and claimed in U.S. Pat. No. 4,851,656 and incorporated herein by reference, are types of imaging systems which have a planar surface for receiving a substrate. An optical exposure head is located on a movable gantry apparatus and is rastered above the substrate during exposure. Internal drum devices, on the other hand, have a cylindrical drum surface portion to receive a substrate. An beam generating module emits an optical beam onto a spinning mirror, and the mirror reflects the beam onto the substrate. As the spinning mirror spins, the reflected beam advances across the substrate surface from a starting edge of the surface to an ending edge thereof, forming a scan line which is perpendicular to the axis of the drum. The spinning mirror is mounted on a carriage which moves in a direction perpendicular to the scan line. After the reflected beam advances to the ending edge, the carriage moves perpendicular to the scan line. When the reflected beam begins again at the starting edge of the surface, the beam advances across a new scan line. The reflected beam advances across the entire surface area of the drum in this manner.

An internal drum photoplotter presently manufactured by assignee, Gerber Scientific, Inc., model Cresent 42 includes a carriage having two orthogonal surfaces magnetically coupled to a rigid rail that extends along the longitudinal axis of the drum. The carriage is suspended below the rail. A plurality of friction pads formed of polymeric material are secured to the orthogonal surfaces of the carriage. The friction pads maintain the carriage a predetermined distance from the rail. A spinner motor and mirror for reflecting the optical beam to the media is mounted to the under surface of the carriage. The carriage is driven along the rail by a drive system comparing a lead screw and a stepper motor. A motor drive system energizes the stepper motor in minute increments to thereby rotate the lead screw resulting in movement of the carriage along the rail. The stepper motor is driven in an open loop mode.

Different media respond to optical beams having different wavelengths, and using a particular media in an imaging process therefore requires a beam having the proper wavelength for that media. For example, Silverlith by Dupont responds to a wavelength of 488 nanometers, N90 by Hoechst responds to wavelengths of both 488 nanometers and 532 nanometers and Setprint by Agfa responds to wavelengths between 633 nanometers and 730 nanometers. In addition, Kodak manufactures thermal plate which responds to a wavelength of 890 nanometers, and Presstech manufactures thermal plate which responds to a wavelength of 1064 nanometers. Different media have characteristics which are desirable to different users and for different applications. Relevant characteristics include the cost of the media, how the media is processed, preference of one media supplier over others, beam power needed to expose the media and the speed at which the media can be exposed.

Imaging onto film media is a known imaging technique. In certain applications, the imaged film is then brought into contact with a plate to make a contact copy of the image on the plate. Imaging directly onto the plate is a newer technology which is advantageous since the steps of imaging onto the film and copying the image from the film to the plate can then be eliminated.

Recently, imaging processes have begun using media which are responsive to thermal imaging beams, such as the hereinabove described media responsive to wavelengths of 870 and 1064 nanometers. Thermal media are becoming increasingly popular for several reasons. Using thermal media allows direct imaging onto plate which, as described hereinabove, is advantageous over imaging onto plate indirectly. Thermal media furthermore does not require chemical processing, as do other media, and can be exposed to brighter lights without ill effects, unlike other media which require handling in a dark room. In addition, imaging onto thermal media produces sharper images.

Unfortunately, the imaging wavelength required to image onto plate can be different then the imaging wavelength to image onto film. As described hereinbelow, conventional imaging systems can either image plate or can image film, but cannot image both plate and film. Conventional imaging systems are designed for use with a beam having only a prescribed imaging wavelength. For example, the beam generating module generates a beam having the imaging wavelength and the scanning mirror substantially reflects a beam having the imaging wavelength. Optical components which interact with the beam, such as the scanning mirror and lenses to focus and magnify the beam, must likewise be designed for use with a beam having the imaging wavelength. Lenses and mirrors typically exhibit different optical properties for different wavelength beams. Known imaging systems can therefore image only media which are responsive to the imaging wavelength. To image at a plurality of wavelengths, optical components, namely lenses and mirrors, must perform well at the plurality of wavelengths and a plurality of sources must be present.

Furthermore, the beam generating module must be able to generate a beam having any of the plurality of wavelengths. Known beam generating devices can either generate a beam having a single wavelength or generate a beam having a wavelength within a prescribed range. It is extremely expensive and difficult to provide an beam generating module which generates a beam of arbitrarily selected wavelengths, and thus a plurality of beam generating modules must be provided in the imaging system. However, each beam generating module generates a beam which starts at a different point, the location of its respective beam generating module.

Thus, each beam generating module generates a beam which travels along a path different than other beams. Each of these beams must be aligned with the optical components of the imaging system. Accordingly, conventional imaging systems cannot image at a plurality of imaging wavelengths.

It would be advantageous to provide an imaging system which supports a plurality of imaging wavelengths. This type of imaging system would be more flexible and have broadened applicability, thereby allowing the imaging system to serve multiple applications. It would be further advantageous to provide an imaging system which can image both plate and film.

It would also be advantageous to provide an imaging system which is capable of subsequent modification to be useful in one of several processes to image at new imaging wavelengths. For example, though thermal media is advantageous, it is not as popular as more established types of imaging media. It would be advantageous to provide an imaging system which is capable of modification to image thermal media once thermal media became more established and commercially accepted.

It would also be advantageous to provide an imaging system which is modular and easy to adapt to different imaging wavelengths.

SUMMARY OF THE INVENTION

An object of the present invention is to provide an imaging system is capable of imaging at a plurality of imaging wavelengths.

Another object of the present invention is to provide an imaging system which is capable of modification to image at additional new wavelengths.

Another object of the present invention is to provide an imaging system which accepts any one of a plurality of beam generating modules, wherein each of the beam generating modules adapts the imaging system to image at a one of a plurality of prescribed imaging wavelengths.

Still another object of the present invention to provide an imaging system which includes a plurality of beam generating modules, wherein each of the beam generating modules allows the imaging system to image at a one of a plurality of prescribed wavelengths.

According to the present invention, an imaging system for imaging a substrate surface at a plurality of imaging wavelengths comprises a replaceable beam generating module, a spinning mirror and a controller. The beam generating module generates an imaging beam in dependence on beam command signals. The imaging beam has a wavelength which is a one of the plurality of imaging wavelengths. The beam generating module further presents the imaging beam along a prescribed path, and the beam generating module generates wavelength signals indicative of the imaging beam wavelength.

The spinning mirror receives the imaging beam from along the prescribed path and substantially reflects the imaging beam onto the substrate surface. As the mirror spins, it advances the reflected imaging beam across the substrate surface in a direction defining a scan line. The spinning mirror is capable of substantially reflecting a received beam having any one of the plurality of imaging wavelengths.

The controller receives the wavelength signals, and generates the beam command signals in dependence on the wavelength signals. The beam command signals control generation of the imaging beam in accordance with a prescribed pattern to image upon the substrate surface.

According to another aspect of the present invention, an imaging system for imaging a substrate surface at a plurality of imaging wavelengths is capable of receiving a one of a plurality of replaceable beam generating modules which generate an imaging beam in dependence on beam command signals. The imaging beam has a wavelength which is a one of the plurality of imaging wavelengths. The imaging system comprises a mounting apparatus, a spinning mirror and a controller. The mounting apparatus fixes a location of a one of the plurality of replaceable beam generating modules such that each replaceable beam generating module which is fixed by the mounting apparatus presents the imaging beam along a prescribed path.

The spinning mirror receives the imaging beam from along the prescribed path and substantially reflects it onto the substrate surface. The mirror further advances the reflected imaging beam, as the mirror spins, across the substrate surface in a direction defining a scan line. The spinning mirror is capable of substantially reflecting a received beam having any one of the plurality of imaging wavelengths.

The controller receives wavelength signals indicative of a wavelength of the imaging beam, and generates beam command signals in dependence thereupon. The beam command signals control generation of the imaging beam in accordance with a prescribed pattern to image upon the substrate surface.

According to still another aspect of the present invention, an imaging system for imaging a substrate surface at a plurality of imaging wavelengths comprises a first replaceable beam generating module, a second replaceable beam generating module, a beam combining apparatus, a spinning mirror, a wavelength selection apparatus and a controller. The first and second replaceable beam generating modules generate first and second imaging beams in dependence on beam command signals. The first and second imaging beams have a first and second wavelength respectively, both of which are a one of the plurality of imaging wavelengths. The first and second replaceable beam generating modules further generate first and second wavelength signals each indicative of the first and second wavelengths. The beam combining apparatus receives the first and second imaging beams, and presents them along a prescribed path.

The spinning mirror receives the first and second imaging beams from along the prescribed path, and substantially reflects the beams onto the substrate surface. The spinning mirror also advances the reflected imaging beams, as the mirror spins, across the substrate surface in a direction defining a scan line. The spinning mirror is capable of substantially reflecting a received beam having any one of the plurality of imaging wavelengths.

The wavelength selection apparatus generates wavelength selection signals indicative of a one of the first and second wavelengths. The controller receives the first and second wavelength signals and generates the beam command signals in dependence thereupon. The beam command signals control generation of a one of the first and second imaging beams in accordance with the wavelength selection signals and further in accordance with a prescribed pattern to image upon the substrate surface.

BRIEF DESCRIPTION OF THE DRAWINGS

FIG. 5 is a simplified illustration showing an beam generating module which is located on an imaging system.

FIG. 6 is a simplified illustration showing another beam generating module which is located on an imaging system.

FIG. 7 is a simplified illustration showing two beam generating modules which are located on an imaging system.

FIG. 9 is a more detailed illustration of the zoom lens system of FIG. 8.

DESCRIPTION OF PREFERRED EMBODIMENT

An imaging system provided in accordance with the present invention is capable of imaging at several imaging wavelengths. In the preferred embodiment, an imaging system includes a plurality of beam generating modules, wherein each of the beam generating modules adapts an imaging system to image at a one of a plurality of prescribed imaging wavelengths. The imaging system is thus capable of imaging at a plurality of wavelengths without changing beam generating modules. The beam generating modules can be substituted with other beam generating modules, adapting the imaging system to still more imaging wavelengths. In another embodiment, an imaging system accepts any one of a plurality of the beam generating modules. Replacing a beam generating module which is installed in the imaging system with another beam generating module changes the imaging wavelength of the imaging system.

An imaging system provided in accordance with the present invention is flexible, and can be upgraded to image at different wavelengths by incorporating a new imaging module therein rather than by repurchasing an entire imaging system. Thus, a customer who purchases an imaging system which images one type of media is able to later change the beam generating module of the imaging system to image a different type of media. A customer who does not want to risk imaging a new type of media at the present time uses the imaging system with a beam generating module which provides a more established wavelength, and later upgrades the beam generating module to one of a different wavelength appropriate for the new type of media. Similarly, even if a new media is introduced after a customer purchases the imaging system, a beam generating module which generates a beam having a wavelength appropriate for the new media can be added to the imaging system. Also, an imaging system provided in accordance with the present invention is advantageous in applications which require imaging at one wavelength and filming at another wavelength.

Figure 1:
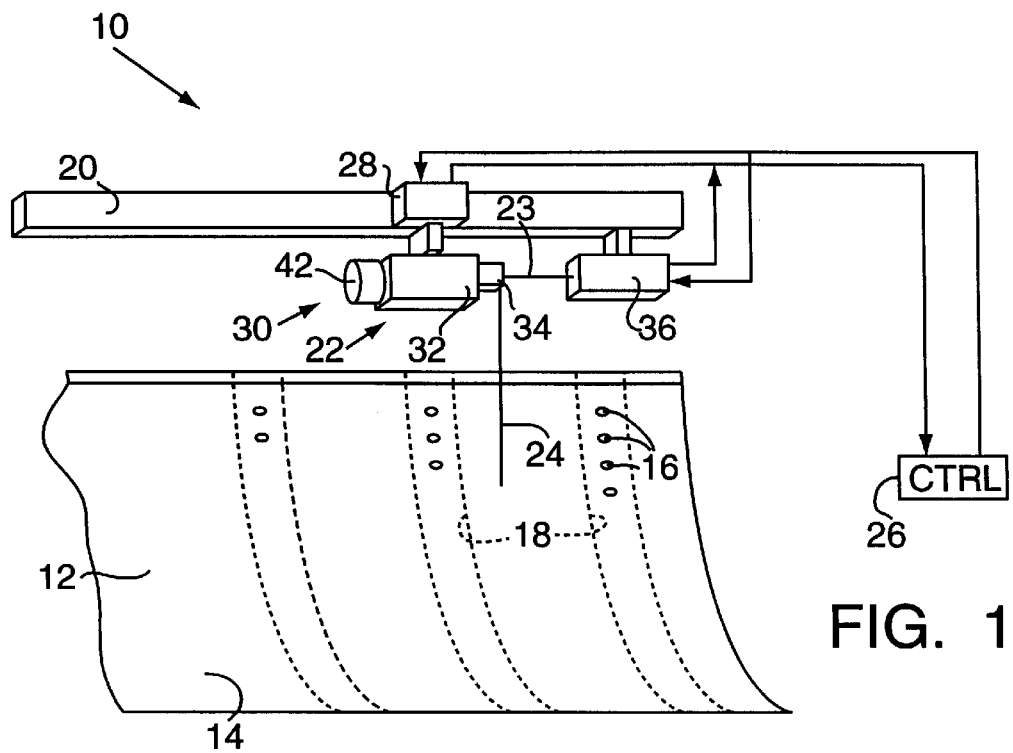
FIG. 1 is a simplified schematic illustration of a portion of an internal drum in an imaging system provided in accordance with the present invention.
Figure 2:
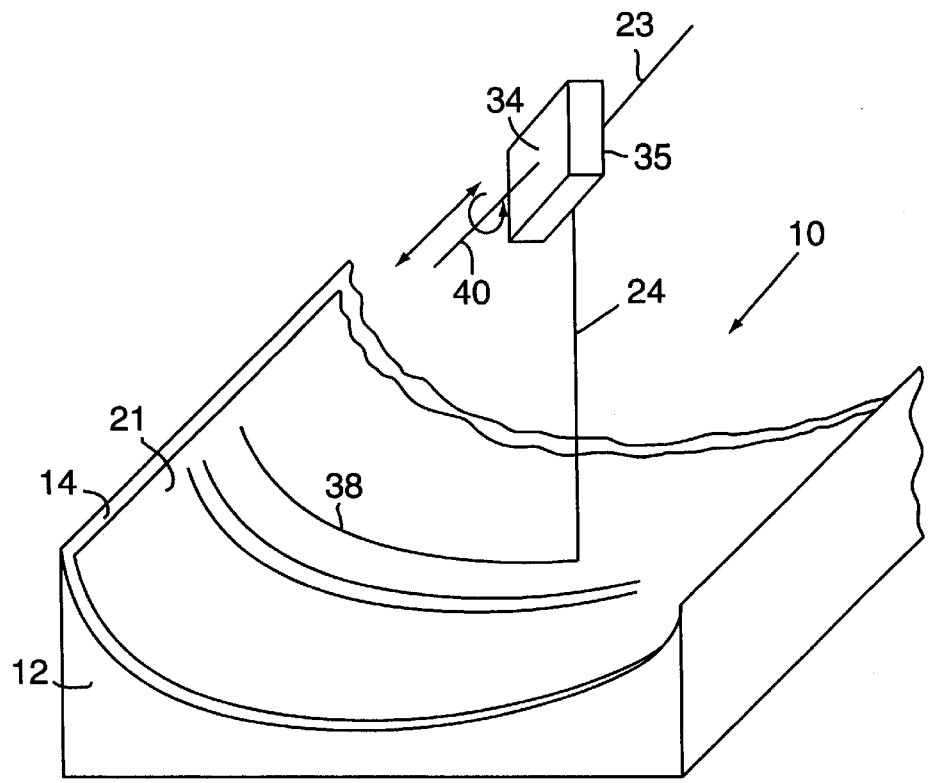
FIG. 2 is a simplified illustration showing the system of FIG. 1 scanning an optical beam across a portion of a substrate surface.

Referring now to FIGS. 1 and 2, a portion of an internal drum imaging system 10 has an internal drum 12 with a surface 14 that comprises part of a cylinder. The internal drum is carefully fabricated and must maintain the preferred geometry (i.e., cylindricity) of the surface 14 with great accuracy. To that end the internal drum is a substantial structure preferably of cast aluminum with a series of reinforcing ribs (not shown) spaced along an outside perimeter.

As shown in FIG. 2, the surface 14 is adapted to receive a substrate 21. The substrate 21 may be a sheet of aluminum or polymer, such as polyester, having a photosensitive emulsion coated on one surface thereof or a sheet of photosensitive film. The surface 14 further includes a plurality of holes 16 (FIG. 1) in fluid communication with a plurality of internal channels 18 through which a conventional vacuum source and associated manifold system (not shown) generates a vacuum. The vacuum holds the substrate in place during an exposure process. Alternative methods can be equivalently used to hold the substrate in place, including electrostatic and mechanical retention techniques.

The imaging system 10 also includes a rail 20 that has a carriage 22 for scanning a reflected optical beam 24 about the substrate surface in response to beam command signals received from a controller 26. The carriage includes a linear encoder 28 for generating signals indicative of the position of the carriage as it moves along the rail, a fast scan apparatus 30 preferably comprised of a linear motor 32 and mirror 34 for receiving an emitted optical beam 23 at a mirror surface 35 from a beam generating module 36, such as a laser, and for exposing a series of scan lines 38 (FIG. 2) on the substrate by rotating the mirror about a spin axis 40, typically at 24,000 revolutions per minute. A rotary encoder 42 is included for generating signals indicative of the angular position of the mirror surface during a scan. The mirror surface is preferably fabricated to have an off-axis parabolic curvature.

The linear motor 32, similar to one manufactured by Trilogy Systems Corp., provides the means to move the carriage 22 along the length of the rail 20. The linear motor 32 is preferably a d.c. brushless motor comprising a coil assembly and a magnetic track assembly. The coil assembly includes preferably a plurality of motor windings or phases (not shown) that are switched or commutated by sinusoidal commutation. Sinusoidal commutation provides near perfect smoothness, meaning the carriage 22 travels at a controlled velocity with little or no bounce or discontinuity in the movement of the carriage. Graphic arts imaging requires a high degree of precision when scanning the imaging beam onto the media and therefore, travel of the carriage 22 along the rail 20 at a constant velocity is critical. Discontinuity in the movement or variation in velocity of the carriage results in the problem of "banding" or longitudinal lines formed in the substrate 21.

Figure 10:
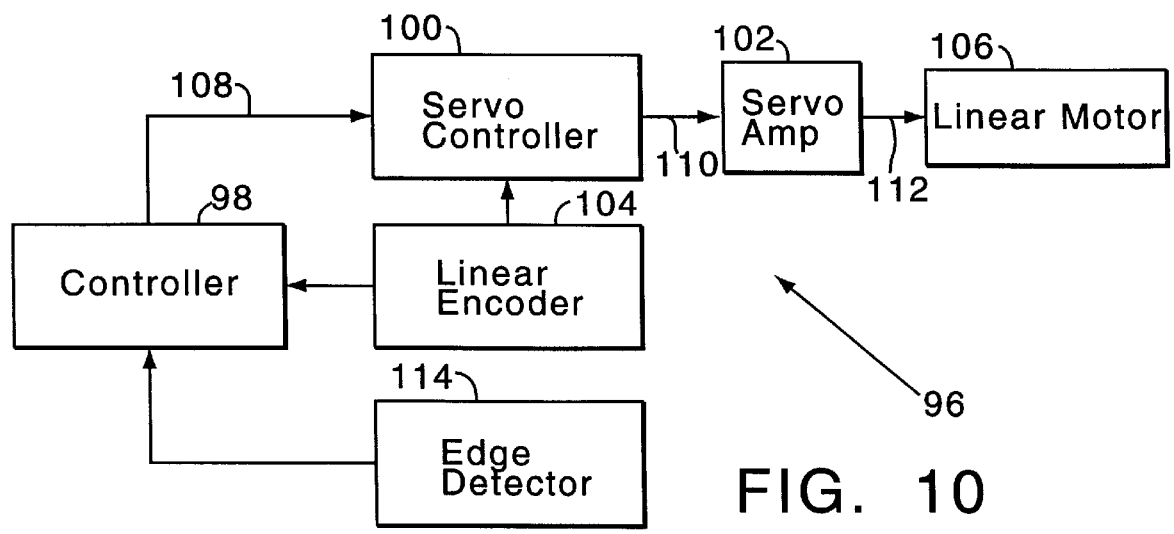
FIG. 10 is a schematic illustration of motor control system of the imaging system of FIG. 1.

Schematically shown in FIG. 10, a motor control system 96 includes a controller 98, a servo controller 100, a servo amplifier 102 and a linear encoder 104. The motor control system 96 provides drive signals to the windings of the linear motor 106. The controller 98 provides input signals over a serial RS232 port 108 to the servo controller 100, such as one manufactured by Delta Tau. The servo controller 100 provides a signal through conductor 110 to the servo amplifier 102 which then provides sinusoidal drive signals to the coil assembly of the linear motor 106 through conductor 112. The linear encoder 104 provides a signal indicative of the position of the carriage 22 along the rail 20 to the servo controller 100 to close the position loop of the servo and to the controller 98. The controller 98 stores the position of the carriage 22 in memory and monitors the position of the carriage 22 as it travels along the rail 20. The controller also initiates other functions that are dependent upon the position of the carriage on the rail such as starting and stopping the motor, controls velocity of the motor, provides signal to begin and end the scanning onto the substrate.

The linear encoder 28 includes a scale and an encoder head. The scale is mounted longitudinally to the lower edge of the rail and the encoder head is mounted to the edge of the horizontal plate of the rail. In the preferred embodiment, the resolution of the encoder is 0.25 micron.

In the operation of the motor control system 96, the controller 98 provides a signal to the servo controller 100 to energize the linear motor 106 and move the carriage to a predetermined initial position at one end of the rail 20. A position register of the controller 98 is then initialized to zero counts. After the substrate 21 is secured within the drum 12, the carriage 22 is commanded by the controller to move forward until the edge of the media is detected by an edge detector 114. The controller 98 stores in memory the number of counts between the initial position and the edge of the substrate 21 and commands the linear motor 106 to move the carriage 22 to approximately one inch back from the edge of the media. This predetermined distance permits the carriage 22 to accelerate to a constant velocity before reaching the edge of the substrate. When the scanning process begins, the controller 98 energizes the linear motor 106 to move the carriage. When the controller determines the carriage 22 has reached the edge of the media, the controller provides an initiating signal to begin scanning the image on the media. After the carriage 22 has traveled the commanded distance along the rail 20, the controller 98 stops the carriage and reads its position. The controller then commands the carriage to slew or scram the carriage back to the zero position at a predetermined velocity.

Figure 3:
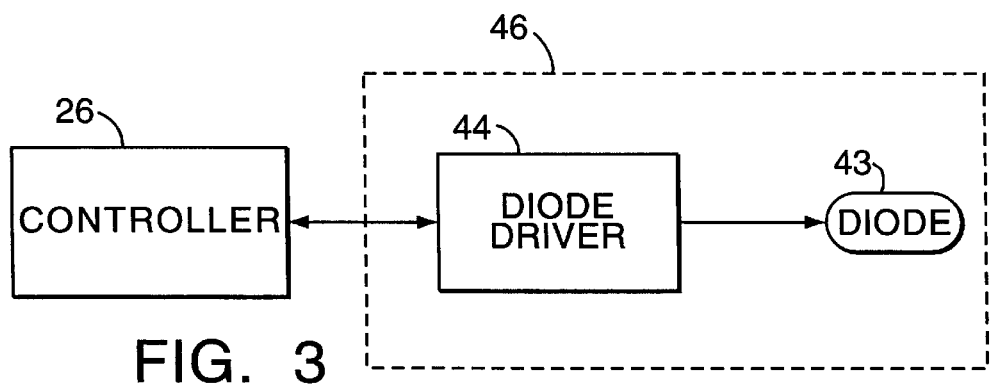
FIG. 3 is a block diagram of electronic components of a laser diode module.

As described hereinabove, in the preferred embodiment the imaging system 10 includes a plurality of beam generating modules. Two types of beam generating modules are described hereinafter, though those skilled in the art will be able to substitute other beam generating modules without departing from the scope of the present invention. FIG. 3 shows a block diagram of the electronic components of a first type of beam generating module, a laser diode module 46. As is known in the art, a laser diode 43 comprises a p-n semiconductor junction which generates coherent, substantially single-wavelength, highly directional beam of electromagnetic radiation when injection current into the diode 43 reaches a diode threshold level. When injection current into the diode 43 is below the diode threshold level, the diode does not emit the laser beam. Thus, controlling current fed to the laser diode 43 controls whether the laser diode 43 emits a laser beam.

A diode driver 44 is an interface between the laser diode 43 and the controller 26, and injects a current into the diode 43 which is dependent upon beam command signals received from the controller 26. Typically, the controller 26 commands the diode to be in a one of two states: an "idle", or "off", state and an "on" state. When the controller sends beam command signals indicative of the idle state to the diode driver, the diode driver injects current which is below the diode threshold level into the diode, and the diode does not emit a laser beam. When the controller sends beam command signals indicative of the on state to the diode driver, the diode driver injects current which is above the diode threshold level into the diode, and the diode emits a laser beam, preferably a laser beam having a wavelength of 670 nanometers. The controller 26 receives from the diode driver 44 signals indicative of the wavelength of a beam which the module 46 emits. As discussed hereinbelow, the controller 26 requires information regarding the wavelength of a beam in order to determine how the beam will interact with optical components of the imaging system.

Figure 4:
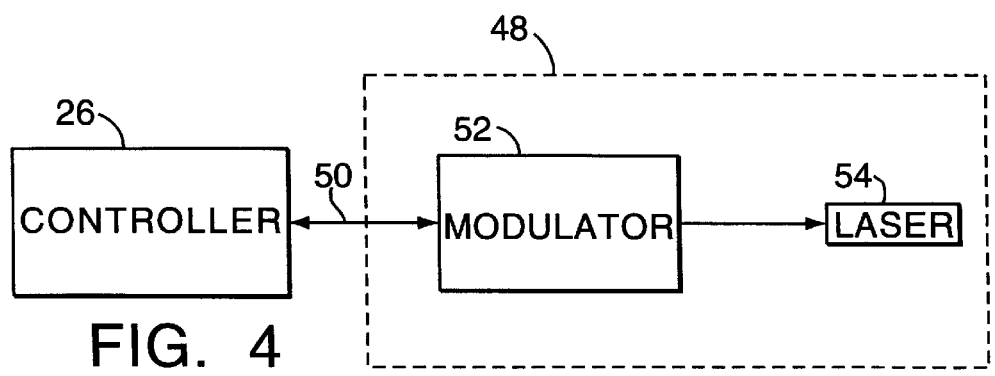
FIG. 4 is a block diagram of electronic components of a laser module.

FIG. 4 shows a block diagram of the electronic components of a second type of beam generating module, a laser module 48. The laser module 48 comprises a modulator 52 which controls a laser unit 54 in dependence on commands received from the controller 26 via a serial line 50. The laser unit 54 is a self-contained, self-regulating device which may be one of many types of laser beam emitting devices, preferably an infrared laser which emits a beam having a wavelength of 1.06 microns. The controller 26 sends beam command signals to the modulator which command the laser to turn the laser unit on, to turn the laser unit off and to set the output power of a beam which the laser unit 54 emits. The controller 26 receives from the laser module 48 signals indicative of the wavelength of a beam which the module 48 emits.

With reference to FIGS. 5 and 6, a beam generating module 56 is located on an imaging system 58 such that a beam 57 emitted by the beam generating module 56 travels along a prescribed path 60. If, for example, a second beam generating module 62 replaces the beam generating module 56 in the imaging system 58, then a beam 63 emitted by the second beam generating module 62 reflects off of a mirror 64 inside the beam generating module 62 and also travels along the prescribed path 60. In this manner, replacing beam generating modules does not require realignment with any optical components of the imaging system 58, such as the mirror 34. A new beam generating module which is installed in an imaging system is at first typically out of alignment with the rest of the imaging system due to minute tolerance variations, such as in the dimensions of the module or the precise location from which the beam is emitted. The beam generating module is properly aligned by adjusting mounting components of the beam generating module, such as pins or screws.

FIG. 7 shows two beam generating modules 66 and 68 which are simultaneously included on an imaging system 70. A beam 72 emitted by the beam generating module 66 and another beam 74 emitted by the beam generating module 68 both travel along a prescribed path 76, though no more than one of the beams 72 and 74 is emitted at any time. A wavelength selector, such as a toggle switch 73, sends a signal to the controller which determines which of the two beam generating modules is active and emits a beam. The modules 66 and 68 emit beams of different wavelengths, and thus which wavelength should be selected depends on the media to image. Since the imaging system 70 includes more than a single beam generating module, the imaging system 70 must also provide a beam combiner to present both beams 72 and 74 along the same path 76. In the preferred embodiment, the beam combiner is a mirror 78 which has a surface 79 which is coated with a substance that reflects the wavelength of the beam 72, and is transparent to the wavelength of the beam 74. Thus, the beam 72 reflects off of the surface 79 and travels along the path 76, and the beam 74 passes through the mirror 78 and travels along the path 76. Though the beam combiner is illustrated as a mirror, the beam combiner can also be a prism, diffractive optics, holograms or a wavelength selectable beam splitter. Furthermore, beam generating modules can be located at several positions on an imaging system, though the examples in FIGS. 5–7 show beam generating modules in only a few positions.

Since an imaging system provided in accordance with the present invention images at a plurality of wavelengths, optical components of the imaging system must also function at that plurality of wavelengths. For example, referring again to FIG. 2, the mirror surface 35 which reflects an optical beam 23 must reflect beams which have one of the plurality of imaging wavelengths. The mirror surface 35 therefore has a coating which reflects that plurality of wavelengths. The coating is either a "broadband" coating which reflects all wavelengths, or a coating which reflects the plurality of imaging wavelengths but does not reflect other wavelengths. The coating preferably has a reflectance of at least 90% to beams having any of the plurality of wavelengths. As is known in the art, reflective coatings may be constructed of many materials, such as multiple layers of a dielectric material, wherein each layer has a thickness and index of reflection such that the layer reflects a prescribed wavelength or wavelengths. Similarly, a coating comprising multiple layers of a dielectric material can reflect certain wavelengths and passes other wavelengths.

It is known in the art that when a single-frequency optical beam is incident upon a reflective surface, a polarization of a beam which reflects off of the reflective surface is generally different than a polarization of the beam incident upon the surface. The change in polarization between the incident beam and the reflected beam depends upon an angle of incidence between the incident beam and the surface. Since an imaging system provided in accordance with the present invention typically includes a spinning mirror which advances a reflected beam across a substrate, the polarization of the reflected beam changes as the mirror spins and the angle of incidence between the incident beam and the mirror surface changes. It is therefore a further requirement of the mirror coating that the reflectance of the coating does not substantially vary as the polarization changes. It is preferred that the reflectance change by less than 2% as the polarization changes.

Figure 8:
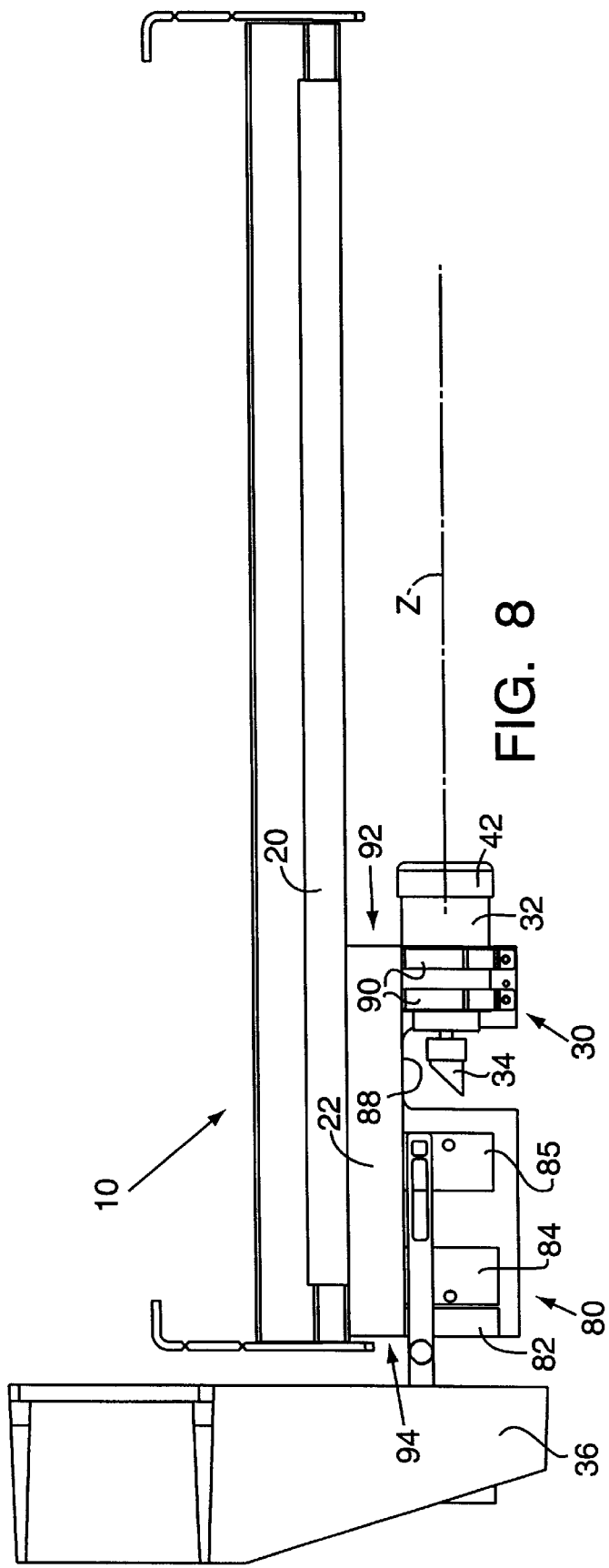
FIG. 8 is a simplified illustration showing a zoom lens system of an imaging system.

Referring to FIGS. 8 and 9, in the preferred embodiment the imaging system 10 further includes a zoom lens system 80. The zoom lens system 80, described in greater detail hereinafter, includes a plurality of lens 82, 84, 85 secured to the carriage 22 for expanding or increasing the diameter of the emitted optical beam 23 from the light source. The lenses 82, 84, 85 ideally transmit, and do not reflect, beams having a one of a plurality of desired imaging wavelengths. Preferably, the reflectance of the lenses 82, 84, 85 to beams of the plurality of desired imaging wavelengths is less than 0.5%.

The fast scan apparatus 30 and zoom lens system 80 are secured to the lower orthogonal surface 88 of the carriage 22. The fast scan apparatus 30 is mounted to the carriage 22 by a pair of straps 90 to the forward end 92 of the carriage such that the mirror 34 is coaxial with a central axis z of the internal drum 12.

The zoom lens system 80 is mounted at the rearward end 94 of the carriage 22 and includes three coaxially spaced lenses 82, 84, 85 for expanding the diameter or magnification of the emitted beam 23 generated by the module 36. The zoom lens system 80 minimizes the effects of optical turbulence which adversely affects the image quality. In the internal drum, the emitted beam is exposed to air turbulence as it travels down the central axis z of the drum 12 to the mirror 34 on the carriage 22. It is known that the greater the diameter of the axial feed beam, the greater the effects of air turbulence. For this reason, the present invention sends a smaller and fixed size beam down the axis z of the internal drum 12. The typical diameter of the beam for a system having no zoom lens system is approximately 16.4 millimeters (mm) while the diameter of the beam is approximately 4 mm for a system having a zoom lens system on the carriage 22.

In the preferred embodiment of the zoom lens system 80, the characteristics of the lens 82, 84, 85 provide afocal expansion of the diameter of the feed beam. "Afocal" means that the emitted beam and output beam of the zoom lens system 80 are both parallel to the axis of the lens. One skilled in the art, however, would recognize that any type of multi-configuration lens is possible without departing from the invention. The first or rearward most lens 82 is fixed securely to the carriage. The second and third lenses 84, 85 respectively are secured to the carriage by magnetic coupling. Two independently controlled air bearings (not shown) provide the means for adjustably positioning the lenses 84, 85 to vary the diameter and focus of the axial feed beam exiting the zoom lens system 80.

A zoom lens system is especially advantageous in an imaging system which images at a plurality of imaging wavelengths. A reflected beam which is advanced across a substrate surface has a diameter at the substrate surface, called the spot size, which depends on the wavelength of the reflected beam. The smaller the spot size, the greater the resolution of the imaged media. The beam which is incident upon the mirror also has a diameter, called the beam diameter. The spot size is inversely proportional to the beam diameter $$d_s = 2.44 * \lambda * f/d \tag{1}$$

where:

$d_s$ is the spot size $\lambda$ is the wavelength f is the focal length of the lens d is the beam diameter For two imaging wavelengths $\lambda_1$ and $\lambda_2$ and two beam diameters $d_1$ and $d_2$ of beams having the wavelengths $\lambda_1$ and $\lambda_2$ respectively before the beams pass through the zoom lens system, then without any magnification by the zoom lens system there are two spot sizes, or resolutions, $r_1$ and $r_2$. If a beam diameter of $d_1$ corresponds to a desired resolution $r_1$, then the zoom lens system must not change the diameter of beams of imaging wavelengths $\lambda_1$. However, if the diameters $d_1$ and $d_2$ are related by the following equation:

$$d_2 = 0.8 d_1 \tag{2}$$

then to obtain the desired resolution $r_1$ when the imaging wavelength is $\lambda_2$, the adjustable zoom lens system must increase beam diameter by a factor of 1/0.8=1.25. Thus, the lens position system corrects for different beam diameters in different wavelength beam generating modules, thereby providing a desired resolution regardless of imaging wavelength.

To implement this correction, the controller receives from a beam generating module wavelength signals indicative of the wavelength of a beam which the beam generating module emits. The controller, in dependence on the wavelength signals, generates zoom lens command signals which set an appropriate magnification level for the desired spot size, or resolution. Preferably, the controller includes a look-up table which describes, for a given resolution, beam diameters required for different wavelengths, as well as required zoom lenses system magnification factors necessary to adjust the beam diameter and achieve the desired resolution.

The rate at which a beam is reflected off of a spinning mirror and advanced across a substrate depends on the rate at which the spinning mirror rotates. Since the rotation rate of the spinning mirror is typically fixed, it takes a fixed amount of time for the mirror to advance the beam a fixed distance across the substrate. If the spot size is small, many spots fit in this fixed distance and so the beam is turned on and off many times during this fixed time to image. On the other hand, if the spot size is large, fewer spots fit in this fixed distance and so the beam is turned on and off fewer times during this fixed time. Accordingly, the spot size affects the rate at which a beam is turned on and off, also known as the beam modulation rate. The controller therefore adjusts the modulation rate of the beam in dependence on the wavelength signals received from the beam generating module which emits the beam.

What is claimed is:

1. An imaging system for imaging a substrate surface at a plurality of imaging wavelengths, the system comprising:

a replaceable beam generating module for generating an imaging beam in dependence on beam command signals, said imaging beam having a wavelength which is a one of the plurality of imaging wavelengths, said beam generating module further for presenting said imaging beam along a prescribed path, said beam generating module further for generating wavelength signals indicative of the imaging beam wavelength;

a spinning mirror for receiving said imaging beam from along said prescribed path and for substantially reflecting said imaging beam onto the substrate surface and for advancing the reflected imaging beam, as said mirror spins, across the substrate surface in a direction defining a scan line, wherein said spinning mirror is capable of substantially reflecting a received beam having any one of the plurality of imaging wavelengths; and controller means for receiving said wavelength signals, and for generating said beam command signals in dependence on said wavelength signals, wherein said beam command signals control generation of said imaging beam in accordance with a prescribed pattern to image upon the substrate surface.

2. The imaging system of claim 1, further comprising:
mounting means for fixing a location of said replaceable beam generating module such that replaceable beam generating module presents said imaging beam along said prescribed path.

3. The imaging system of claim 1, further comprising:
a collimating lens for receiving said imaging beam and for collimating said imaging beam before said spinning mirror receives said imaging beam.

4. The imaging system of claim 1, wherein said spinning mirror comprises:
a mirror surface; and
an optical coating upon said mirror surface which substantially reflects a beam having any one of the plurality of imaging wavelengths.

5. The imaging system of claim 4, wherein said optical coating comprises a plurality of layers of dielectric material.

6. The imaging system of claim 1, wherein said spinning mirror does not substantially affect beam polarization, such that a polarization of said imaging beam before said spinning mirror receives said imaging beam is substantially the same as a polarization of the reflected imaging beam.

7. The imaging system of claim 1, further comprising a zoom lens for receiving said imaging beam and further for magnifying said imaging beam in dependence on zoom lens command signals; and wherein said controller generates said zoom lens command signals in dependence on said wavelength signals.

8. An imaging system for imaging a substrate surface at a plurality of imaging wavelengths, the system capable of receiving a one of a plurality of replaceable beam generating modules for generating an imaging beam in dependence on beam command signals, said imaging beam having a wavelength which is a one of the plurality of imaging wavelengths, the system comprising:

mounting means for fixing a location of a one of the plurality of replaceable beam generating modules, wherein said location is such that each replaceable beam generating module which is fixed by said mounting means presents said imaging beam along a prescribed path.

a spinning mirror for receiving said imaging beam from along said prescribed path and for substantially reflecting said imaging beam onto the substrate surface and for advancing the reflected imaging beam, as said mirror spins, across the substrate surface in a direction defining a scan line, wherein said spinning mirror is capable of substantially reflecting a received beam having any one of the plurality of imaging wavelengths; and controller means for receiving wavelength signals indicative of a wavelength of said imaging beam, and for generating beam command signals in dependence on said wavelength signals, wherein said beam command signals control generation of said imaging beam in accordance with a prescribed pattern to image upon the substrate surface.

9. An imaging system for imaging a substrate surface at a plurality of imaging wavelengths, the system comprising:

a first replaceable beam generating module for generating a first imaging beam in dependence on beam command signals, said first imaging beam having a first wavelength which is a one of the plurality of imaging wavelengths, said first replaceable beam generating module further for generating first wavelength signals indicative of said first wavelength;

a second replaceable beam generating module for generating a second imaging beam in dependence on beam command signals, said second imaging beam having a second wavelength which is a one of the plurality of imaging wavelengths, said second replaceable beam generating module further for generating second wavelength signals indicative of said second wavelength;

beam combining means for receiving said first imaging beam and second imaging beam, and further for presenting said first imaging beam and second imaging beam along a prescribed path;

a spinning mirror for receiving said first imaging beam and said second imaging beam from along said prescribed path and for substantially reflecting said first imaging beam and said second imaging beam onto the substrate surface and for advancing the reflected first imaging beam and the reflected second imaging beam, as said mirror spins, across the substrate surface in a direction defining a scan line, wherein said spinning mirror is capable of substantially reflecting a received beam having any one of the plurality of imaging wavelengths;

wavelength selection means for generating wavelength selection signals indicative of a one of said first wavelength and said second wavelength; and controller means for receiving said first wavelength signals and said second wavelength signals, and for generating said beam command signals in dependence on said first wavelength signals and on said second wavelength signals, wherein said beam command signals control generation of a one of said first imaging beam and said second imaging beam in accordance with said wavelength selection signals and further in accordance with a prescribed pattern to image upon the substrate surface.

10. The imaging system of claim 9, further comprising:
mounting means for fixing a location of a one of said first replaceable beam generating module and said second replaceable beam generating module such that the fixed replaceable beam generating module presents its imaging beam along said prescribed path.

11. The imaging system of claim 9, wherein said beam combining means is a beam combining mirror having a surface, wherein said beam combining mirror surface reflects said first imaging beam along said prescribed path, and wherein said beam combining mirror surface is transparent to said second imaging beam.

12. The imaging system of claim 9, further comprising a zoom lens for receiving said first imaging beam and said second imaging beam, and further for magnifying said first imaging beam and said second imaging beam in dependence on zoom lens command signals; and wherein said controller generates said zoom lens command signals in dependence on said first wavelength signals and said second wavelength signals.

* * * * *

UNITED STATES PATENT AND TRADEMARK OFFICE
CERTIFICATE OF CORRECTION

PATENT NO.   : 5,841,567
DATED        : November 24, 1998
INVENTOR(S)  : David P. Squires & Joseph A. Wheeler It is certified that error appears in the above-identified patent and that said Letters Patent is hereby corrected as shown below:

Column [73] Assignee:  Please correct the name of the Assignee from "BARCO GERBER SYSTEMS" to --GERBER SYSTEMS CORPORATION--.

Signed and Sealed this

Twenty-first Day of September, 1999

Attest:

Q. TODD DICKINSON

*Attesting Officer*    *Acting Commissioner of Patents and Trademarks*